(12) United States Patent
Vianello et al.

(10) Patent No.: US 10,741,757 B2
(45) Date of Patent: Aug. 11, 2020

(54) PROCESS FOR THE MANUFACTURE OF A RECURRENT NEURAL NETWORK CALCULATOR

(71) Applicant: Commissariat A L'Energie Atomique et aux Energies Alternatives, Paris (FR)

(72) Inventors: Elisa Vianello, Grenoble (FR); Selina La Barbera, Grenoble (FR); Jean-Francois Nodin, Grenoble (FR); Raluca Tiron, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/430,464

(22) Filed: Jun. 4, 2019

(65) Prior Publication Data
US 2019/0393412 A1 Dec. 26, 2019

(30) Foreign Application Priority Data
Jun. 5, 2018 (FR) ...................... 18 54877

(51) Int. Cl.
*H01L 45/00* (2006.01)
*H01L 27/24* (2006.01)

(52) U.S. Cl.
CPC ...... *H01L 45/1253* (2013.01); *H01L 27/2472* (2013.01); *H01L 45/16* (2013.01); *H01L 45/1233* (2013.01)

(58) Field of Classification Search
None
See application file for complete search history.

(56) References Cited

U.S. PATENT DOCUMENTS

| | | |
|---|---|---|
| 2010/0220523 A1 | 9/2010 | Modha et al. |
| 2012/0052598 A1 | 3/2012 | Buckley et al. |
| 2014/0214738 A1 | 7/2014 | Pickett |
| (Continued) | | |

OTHER PUBLICATIONS

French Preliminary Search Report dated Mar. 15, 2019 in French Application 18 54877, filed on Jun. 5, 2018 (with English Translation of categories of Cited Documents & Written opinion).

(Continued)

*Primary Examiner* — Angel Roman
(74) *Attorney, Agent, or Firm* — Oblon, McClelland, Maier & Neustadt, L.L.P.

(57) ABSTRACT

The disclosed process includes the successive stages of providing a substrate comprising a dielectric layer; forming a first layer of block copolymers on a part of the dielectric layer, so that the dielectric layer exhibits free zones with a random spatial distribution; etching the free zones, so as to structure the dielectric layer; removing the first layer of block copolymers; forming a first electrode on the structured dielectric layer; forming a memory layer, of resistive memory type, on the first electrode; forming a second electrode on the memory layer; forming a second layer of block copolymers on a part of the second electrode, so that the second electrode exhibits free zones with a random spatial distribution; etching the free zones, so as to structure the second electrode; and removing the second layer of block copolymers.

12 Claims, 2 Drawing Sheets

(56) References Cited

U.S. PATENT DOCUMENTS

| | | | |
|---|---|---|---|
| 2014/0264224 A1* | 9/2014 | Zhang | H01L 45/144 257/2 |
| 2015/0069315 A1* | 3/2015 | Shih | H01L 45/16 257/4 |
| 2015/0104946 A1 | 4/2015 | Park et al. | |
| 2015/0379395 A1 | 12/2015 | Pickett | |
| 2016/0141494 A1* | 5/2016 | Lam | H01L 45/08 257/4 |
| 2018/0212147 A1* | 7/2018 | Ruiz | H01L 45/144 |

OTHER PUBLICATIONS

Demis, E.C. et al. "Atomic switch networks-nanoarchitectonic design of a complex system for natural computing", Nanotechnology, vol. 26, No. 20, 2015, 11 pages.

\* cited by examiner

PROCESS FOR THE MANUFACTURE OF A RECURRENT NEURAL NETWORK CALCULATOR

TECHNICAL FIELD

The invention relates to the technical field of recurrent neural network calculators. Recurrent neural networks are artificial neural networks where the connections between the units form at least one ring within the meaning of graph theory. More specifically, the technical field relates to recurrent neural networks driven by the "Reservoir computing" paradigm. This paradigm is a highly non-linear dynamic system comprising:

- an input layer;
- a hidden layer, known as reservoir, provided with randomly attached recurrent connections;
- a readout layer.

The principle of this paradigm is to project the input layer towards the reservoir, and then to modify the connections proceeding from the reservoir towards the readout layer by a supervised apprenticeship.

In other words, the invention relates to a calculator which is a physical or material implementation (hardware) of the "Reservoir computing" paradigm.

The invention finds its application in particular in the classification of tasks, the extraction of characteristics, the pursuit of objects (tracking), the prediction of robot movements, vocal recognition and sound recognition.

STATE OF THE PRIOR ART

A process for the manufacture of a recurrent neural network calculator, known from the state of the art, in particular from the document "Atomic switch networks—nanoarchitectonic design of a complex system for natural computing", E. C. Demis et al., *Nanotechnology*, 26, 204003, 2015, comprises a stage of random growth of silver nanowires on a structured platinum electrode. The random nature is obtained by a preliminary stage of formation of copper microspheres on the structured electrode. The copper microspheres form a seed layer for the silver nanowires. The process comprises a stage of sulfurization of the silver nanowires, so as to obtain structures of the $Ag/Ag_2S/Ag$ type. Such structures form resistive memory cells of atomic switch type.

Such a process of the state of the art makes possible the manufacture of a calculator which is a physical implementation of the "Reservoir computing" paradigm. However, such a process of the state of the art is not completely satisfactory in so far as the choice of the materials for the resistive memory is restricted. This is because it is necessary to choose a compatible pair of materials, of electrical conductor/dielectric type, for the formation of the nanowires and of the resistive memory cells, in the case in point $Ag/Ag_2S$.

ACCOUNT OF THE INVENTION

The invention is targeted at completely or partially overcoming the abovementioned disadvantages. To end end, a subject-matter of the invention is a process for the manufacture of a recurrent neural network calculator, comprising the successive stages:

a) providing a substrate comprising a dielectric layer;
b) forming a first layer of block copolymers on a part of the dielectric layer, so that the dielectric layer exhibits free zones with a random spatial distribution;
c) etching the free zones of the dielectric layer, so as to structure the dielectric layer;
d) removing the first layer of block copolymers;
d') forming a first electrode on the dielectric layer structured during stage c);
e) forming a memory layer, of resistive memory type, on the first electrode;
f) forming a second electrode on the memory layer;
g) forming a second layer of block copolymers on a part of the second electrode, so that the second electrode exhibits free zones with a random spatial distribution;
h) etching the free zones of the second electrode, so as to structure the second electrode;
i) removing the second layer of block copolymers.

Thus, such a process according to the invention makes possible the physical implementation of a recurrent neural network calculator which can be driven by the "Reservoir computing" paradigm. This is because the block copolymers have the property of self-assembling into dense networks of nanometric objects with the ability to form a lithography mask.

This self-assembling introduces the random nature necessary in the "Reservoir computing" paradigm, that is to say, for example:

- recurrent connections randomly attached in the reservoir:
- a stochastic number of units (one unit corresponding to one resistive memory cell, located at an intersection between the first and second electrodes);
- a random latency time between the units (e.g., a random distance between the units);
- a random weight of the units by a random conductance of the cells of the resistive memory (the cells of the resistive memory being formed by the zones of intersection between the memory layer and the first and second electrodes).

In addition, the lithography mask thus formed by the first and second layers of block copolymers makes it possible to structure the dielectric layer and the second electrode during stages c) and h). The first electrode is also structured during stage d') by being formed on the structured dielectric layer, for example by a conforming deposition. The memory layer is also structured during stage e) by being formed on the structured first electrode, for example by a conforming deposition.

Finally, such a process according to the invention allows freedom with regard to the choice of the material of the memory layer in so far as the memory layer is formed independently of the first and second layers of block copolymers.

Definitions

"Structured electrode" is understood to mean an electrode exhibiting a discontinuous surface delimiting a set of patterns.

"Structured dielectric layer" is understood to mean a dielectric layer (or a plurality of dielectric sublayers) exhibiting a discontinuous surface delimiting a set of patterns.

"Free zones" is understood to mean zones of the dielectric layer or of the second electrode which are not covered with the layer of block copolymers.

"Memory layer" is understood to mean a layer or a plurality of sublayers (for example produced from a material of oxide type or of chalogenide type) forming, with the first and second electrodes, a resistive memory (ReRam—Resistive random-access memory). More specifically, the cells of the resistive memory are located at the intersections between the first and second electrodes.

The process according to the invention can comprise one or more of the following characteristics.

According to one characteristic of the invention, stage b) comprises the successive stages:
b$_1$) forming a layer of a random polymer on the dielectric layer;
b$_2$) grafting the layer of the random polymer to a part of the dielectric layer;
b$_3$) forming the first layer of block copolymers on the layer of the random polymer grafted during stage b$_2$);
b$_4$) removing the grafted layer of the random polymer.

"Random polymer" is understood to mean a polymer having a random coil.

Thus, the layer of the random polymer is a functionalization layer which makes it possible to control the surface energies of the dielectric layer. One advantage provided is that of accentuating the random nature and of improving the quality of the formation of the first layer of block copolymers.

According to one characteristic of the invention, stage g) comprises the successive stages:
g$_1$) forming a layer of a random polymer on the second electrode;
g$_2$) grafting the layer of the random polymer to a part of the second electrode;
g$_3$) forming the second layer of block copolymers on the layer of the random polymer grafted during stage g$_2$);
g$_4$) removing the grafted layer of the random polymer.

Thus, the layer of the random polymer is a functionalization layer which makes it possible to control the surface energies of the second electrode One advantage provided is that of accentuating the random nature and of improving the quality of the formation of the second layer of block copolymers. In addition, the random nature is accentuated by the surface topology of the memory layer resulting from the structuring of the dielectric layer during stage c).

According to one characteristic of the invention, the random polymer is selected from the group consisting of a statistical copolymer, a homopolymer and a self-assembled monolayer.

According to one characteristic of the invention, the block copolymers of the first layer and of the second layer are selected from the group consisting of:
  polystyrene and polymethyl methacrylate, denoted PS-PMMA;
  polystyrene and polylactic acid, denoted PS-PLA,
  polystyrene and poly(ethylene oxide), denoted PS-PEO;
  polystyrene and polydimethylsiloxane, denoted PS-PDMS;
  polystyrene, polymethyl methacrylate and poly(ethylene oxide), denoted PS-PMMA-PEO;
  polystyrene and poly(2-vinylpyridine), denoted PS-P2VP.

According to one characteristic of the invention, the memory layer is made of at least one material selected from the group consisting of HfO$_2$, Al$_2$O$_3$, SiO$_2$, ZrO, a titanium oxide, a chalcogenide and Ta$_2$O$_5$.

According to one characteristic of the invention, the first and second electrodes are made of at least one material selected from the group consisting of Ti, TiN, Pt, Zr, Al, Hf, Ta, TaN, C, Cu and Ag.

According to one characteristic of the invention, the first layer of block copolymers and the second layer of block copolymers respectively formed during stages b) and g) exhibit a thickness of between 30 nm and 50 nm.

Thus, one advantage provided is that of obtaining a lithography mask of good quality for structuring the dielectric layer and the second electrode.

According to one characteristic of the invention, the process comprises a stage j) consisting in forming an encapsulation layer on the second electrode structured during stage h), stage j) being carried out after stage i).

Thus, one advantage provided is that of protecting the calculator from air and moisture.

According to one characteristic of the invention, the dielectric layer structured during stage c) exhibits a pitch, denoted p, and stages d') and e) are carried out so that the first electrode and the memory layer respectively exhibit first and second thicknesses, denoted T$_1$ and T$_2$, adhering to:

$$\frac{p}{2} \leq T_1 + T_2 \leq p$$

Thus, such thicknesses of the first electrode and of the memory layer make it possible to obtain a virtually flat surface topology, so as to facilitate the formation of the second electrode during stage f), which makes it possible to dispense with a stage of formation of an oxide and with a stage of mechanical-chemical polishing of the oxide.

Another subject-matter of the invention is a recurrent neural network calculator obtained by a process in accordance with the invention.

BRIEF DESCRIPTION OF THE DRAWINGS

Other characteristics and advantages will become apparent in the detailed account of different embodiments of the invention, the account being accompanied by examples and with reference to the appended drawings.

It should be noted that the drawings described above are diagrammatic and are not to scale for the sake of readability.

DETAILED ACCOUNT OF THE EMBODIMENTS

The elements which are identical or provide the same function will carry the same references for the different embodiments, for the sake of simplicity.

Figure 1A:
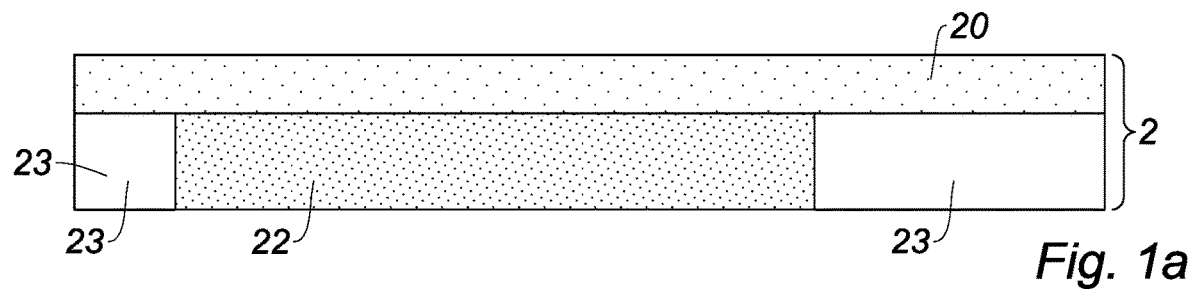
FIGS. 1a to 1g are diagrammatic sectional views illustrating different stages of a process according to the invention, the section being made along the normal to the surface of the substrate.
Figure 1B:
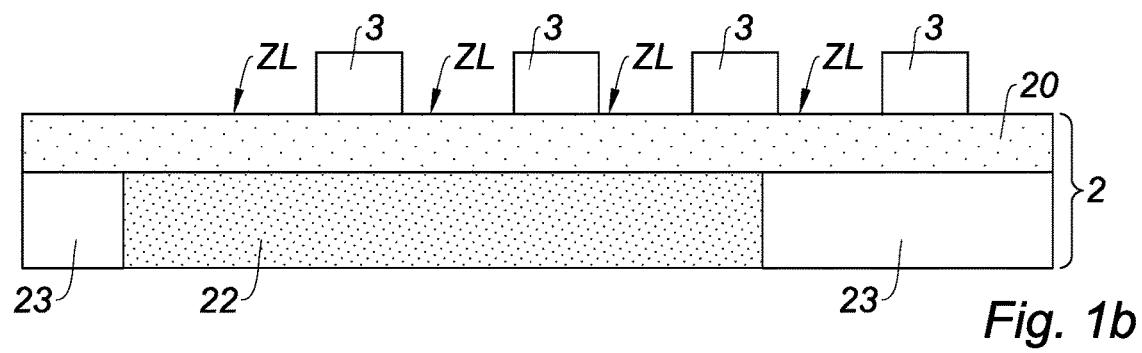
Figure 1C:
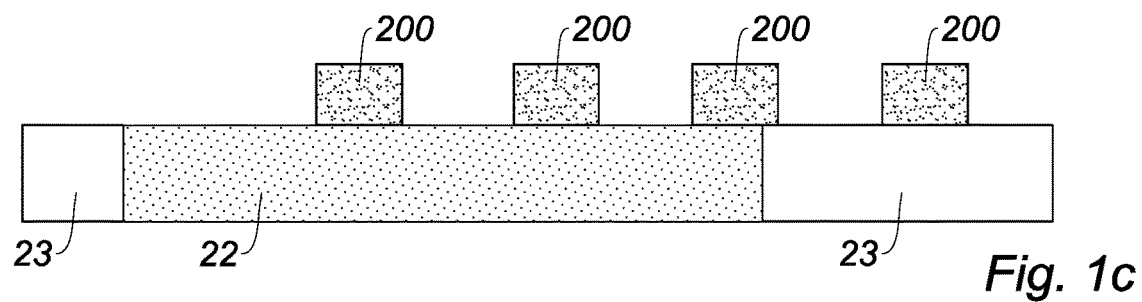
Figure 1D:
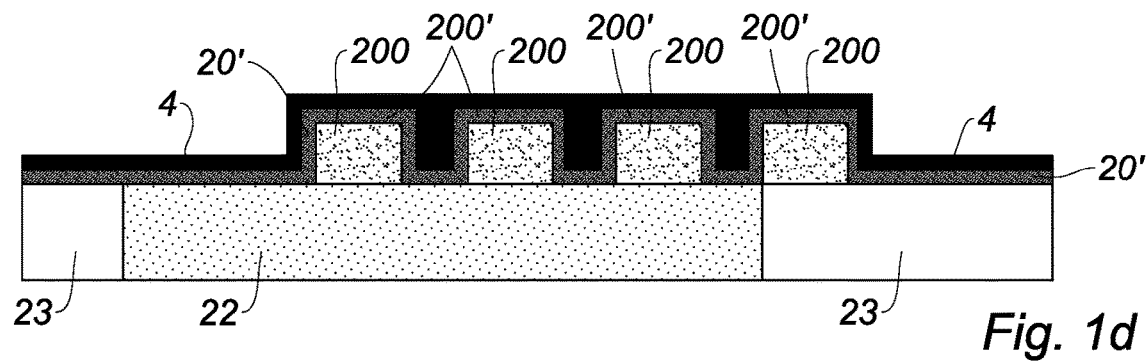
Figure 1E:
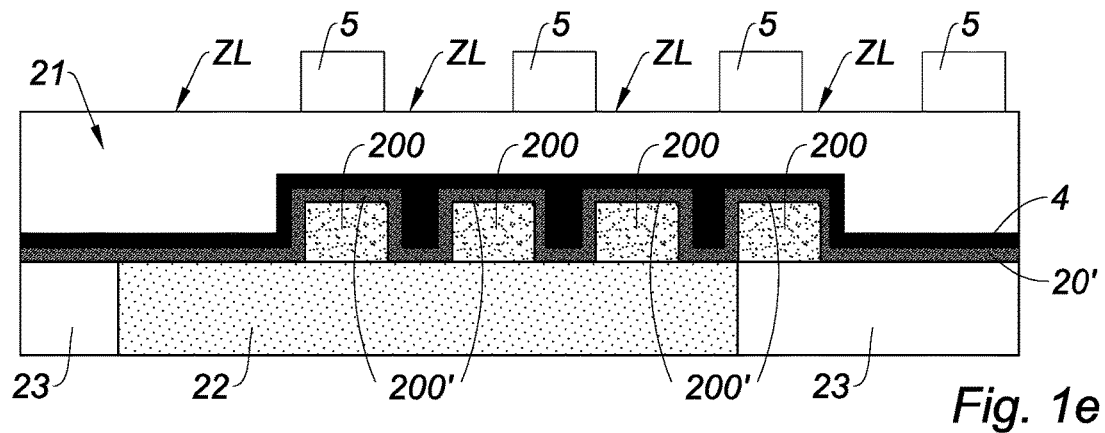
Figure 1F:
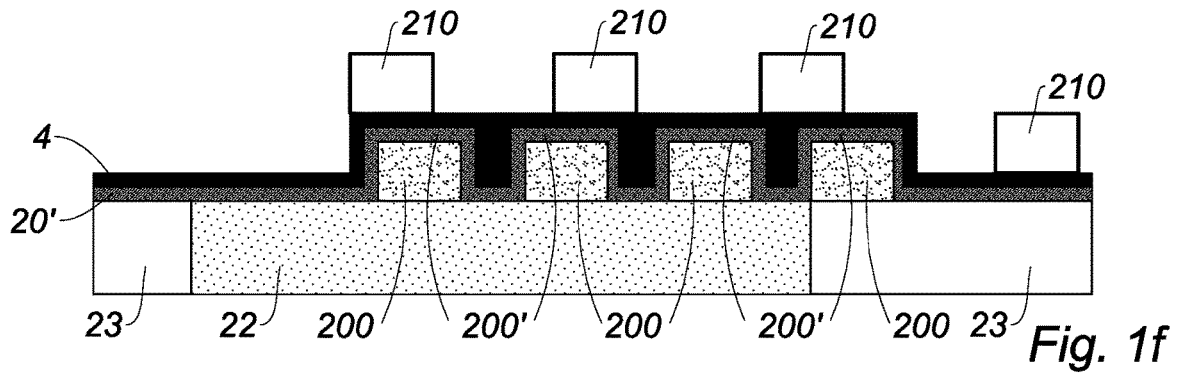

A subject-matter of the invention is a process for the manufacture of a recurrent neural network calculator 1, comprising the successive stages:
a) providing a substrate 2 comprising a dielectric layer 20 (illustrated in FIG. 1a),
b) forming a first layer 3 of block copolymers on a part of the dielectric layer 20, so that the dielectric layer 20 exhibits free zones ZL with a random spatial distribution (illustrated in FIG. 1b),
c) etching the free zones ZL of the dielectric layer 20, so as to structure the dielectric layer 20;

d) removing the first layer 3 of block copolymers (the situation on conclusion of stage d) is illustrated in FIG. 1*c*), d') forming a first electrode 20' on the dielectric layer structured 200 during stage c);

e) forming a memory layer 4, of resistive memory type, on the first electrode 20' (the situation on conclusion of stage e) as illustrated in FIG. 1*d*), f) forming a second electrode 21 on the memory layer 4;

g) forming a second layer 5 of block copolymers on a part of the second electrode 21, so that the second electrode 21 exhibits free zones ZL with a random spatial distribution (the situation on conclusion of stage g) is illustrated in FIG. 1*e*);

h) etching the free zones ZL of the second electrode 21, so as to structure the second electrode 21;

i) removing the second layer 5 of block copolymers (the situation on conclusion of stage i) is illustrated in FIG. 1*f*).

Substrate

The dielectric layer 20 is advantageously an oxide layer, preferably made of $SiO_2$ or of SiN. As non-limiting examples, the dielectric layer 20 can be formed on the substrate 2 by a physical vapour deposition (PVD), a chemical vapour deposition (CVD), by ALD (Atomic Layer Deposition) or also by thermal oxidation.

The substrate 2 preferably comprises a metallization layer 22 (for the contacting) and a layer of an oxide 23, such as $SiO_2$ or SiN. As non-limiting example, the metallization layer 22 can be a structure of the Ti (10 nm)/AlCu (440 nm)/Ti (10 nm)/TiN (100 nm) type.

Formation of the First Layer of Block Copolymers

Stage b) advantageously comprises the successive stages:

$b_1$) forming a layer of a random polymer on the dielectric layer 20;

$b_2$) grafting the layer of the random polymer to a part of the dielectric layer 20;

$b_3$) forming the first layer 3 of block copolymers on the layer of the random polymer grafted during stage $b_2$);

$b_4$) removing the grafted layer of the random polymer.

The random polymer of the layer formed during stage $b_1$) is advantageously selected from the group consisting of a statistical copolymer, a homopolymer and a self-assembled monolayer. The random polymer is advantageously chosen during stage $b_1$) so that the force of attraction between each of the blocks of monomers of the block copolymer and the random polymer layer (i.e., the functionalization layer) is equivalent.

Stage $b_2$) can be carried out using a heat treatment, such as a thermal annealing, or by photocrosslinking. The layer of the random polymer which was not grafted during stage $b_2$) is preferably removed using a wet treatment.

The first layer 3 of block copolymers which is formed during stage $b_3$) is preferably structured using a thermal annealing.

By way of example, stage $b_4$) can be a selective removal when the random polymer and the block copolymers of the first layer 3 have two phases. Stage $b_4$) can be carried out using a UV treatment, followed by a wet-route development. Stage $b_4$) can also be carried out by a plasma etching.

The block copolymers of the first layer 3 are advantageously selected from the group consisting of:

polystyrene and polymethyl methacrylate, denoted PS-PMMA;

polystyrene and polylactic acid, denoted PS-PLA, polystyrene and poly(ethylene oxide), denoted PS-PEO;

polystyrene and polydimethylsiloxane, denoted PS-PDMS;

polystyrene, polymethyl methacrylate and poly(ethylene oxide), denoted PS-PMMA-PEO;

polystyrene and poly(2-vinylpyridine), denoted PS-P2VP.

By way of example, when the block copolymers of the first layer 3 are polystyrene-b-poly(methyl methacrylate), denoted PS-b-PMMA, of lamellar form, the random polymer of the functionalization layer is advantageously polystyrene-r-poly(methyl methacrylate), denoted PS-r-PMMA, preferably comprising 50% by weight of PS and 50% by weight of PMMA. Stage $b_1$) is preferably carried out by spin coating. The spin coating can be carried out by diluting the random polymer in an organic solvent. When the random polymer is PS-r-PMMA, the organic solvent can be propylene glycol monomethyl ether acetate, denoted PGMEA. The solution of the random polymer diluted in the organic solvent can exhibit a concentration by weight of the order of 1.5%. Stage $b_2$) can be carried out by a thermal annealing at a temperature of the order of 250° C. for a period of time of the order of 10 minutes. The thermal annealing can be carried out on a hot plate or in an oven. When the random polymer can be crosslinked, such a thermal annealing makes possible the crosslinking of the random polymer. Stage $b_2$) can comprise a rinsing stage during which the surplus of random polymer is removed using a solvent. When the random polymer is PS-r-PMMA, the solvent is preferably PGMEA. Stage $b_3$) is preferably carried out by spin coating. The spin coating can be carried out by diluting the block copolymer in an organic solvent. When the block copolymer is PS-b-PMMA, the organic solvent can be PGMEA. The solution of the block copolymer diluted in the organic solvent can exhibit a concentration by weight of the order of 1.5%. Stage $b_3$) is advantageously followed by a thermal annealing which makes possible the self-assembling of the block copolymer PS-b-PMMA and the selective removal of the PS-r-PMMA. The thermal annealing is preferably carried out at a temperature of the order of 250° C. for a period of time of the order of 10 minutes.

The first layer 3 of block copolymers which is formed during stage b) advantageously exhibits a thickness of between 30 nm and 50 nm.

Structuring of the Dielectric Layer

Stage c) is preferably carried out by a plasma etching, more preferably of RIE (Reactive-Ion Etching) or of ICP (Inductively Coupled Plasma) type. As non-limiting examples, it is possible to use, as gases, fluorinated gases.

Removal of the First Layer of Block Copolymers

Stage d) is preferably carried out using a UV treatment, followed by a wet-route development. Stage d) can also be carried out by a plasma etching.

Formation of the First Electrode

The first electrode 20' formed during stage d') is advantageously made of at least one material selected from the group consisting of Ti, TiN, Pt, Zr, Al, Hf, Ta, TaN, C, Cu and Ag. The first electrode 20' can be made of an alloy of these materials. The first electrode 20' preferably exhibits a thickness of between 3 nm and 100 nm. The first electrode 20' is advantageously formed during stage d') by a conforming deposition, so as to obtain a structured first electrode 200', preferably by ALD (Atomic Layer Deposition). Thus, the structured first electrode 200' formed during stage d') follows the topology of the structured dielectric layer 200.

Formation of the Memory Layer

The memory layer 4 is advantageously made of at least one material selected from the group consisting of $HfO_2$, $Al_2O_3$, $SiO_2$, ZrO, a titanium oxide, a chalcogenide and $Ta_2O_5$. The memory layer 4 can be formed of a plurality of sublayers made of these materials. As non-limiting examples, the chalcogenide can be GeSe or GeSbTe.

The memory layer 4 advantageously exhibits a thickness of less than or equal to 10 nm.

The dielectric layer 20 structured during stage c) advantageously exhibits a pitch, denoted p. Stages d') and e) are advantageously carried out so that the first electrode 20' and the memory layer 4 respectively exhibit first and second thicknesses, denoted $T_1$ and $T_2$, adhering to:

$$\frac{p}{2} \leq T_1 + T_2 \leq p$$

The memory layer 4 is advantageously formed during stage e) by a conforming deposition, so as to follow the topology of the structured first electrode 200'.

Formation of the Second Electrode

The second electrode 21 is advantageously made of at least one material selected from the group consisting of Ti, TiN, Pt, Zr, Al, Hf, Ta, TaN, C, Cu and Ag. The second electrode 21 can be made of an alloy of these materials. The second electrode 21 preferably exhibits a thickness of between 3 nm and 100 nm. As non-limiting examples, the second electrode 21 can be formed on the memory layer 4 by a physical vapour deposition (PVD), a chemical vapour deposition (CVD) or also by ALD (Atomic Layer Deposition).

Formation of the Second Layer of Block Copolymers

Stage g) advantageously comprises the successive stages:
$g_1$) forming a layer of a random polymer on the second electrode;
$g_2$) grafting the layer of the random polymer to a part of the second electrode;
$g_3$) forming the second layer 5 of block copolymers on the layer of the random polymer grafted during stage $g_2$);
$g_4$) removing the grafted layer of the random polymer.

The random polymer of the layer formed during stage $g_1$) is advantageously selected from the group consisting of a statistical copolymer, a homopolymer and a self-assembled monolayer. The random polymer is advantageously chosen during stage $g_1$) so that the force of attraction between each of the blocks of monomers of the block copolymer and the random polymer layer (i.e., the functionalization layer) is equivalent.

Stage $g_2$) can be carried out using a heat treatment, such as a thermal annealing, or by photocrosslinking. The layer of the random polymer which was not grafted during stage $g_2$) is preferably removed using a wet treatment.

The second layer 5 of block copolymers which is formed during stage $g_3$) is preferably structured using a thermal annealing.

By way of example, stage $g_4$) can be a selective removal when the random polymer and the block copolymers of the second layer 5 have two phases. Stage $g_4$) can be carried out using a UV treatment, followed by a wet-route development. Stage $g_4$) can also be carried out by a plasma etching.

The block copolymers of the second layer 5 are advantageously selected from the group consisting of:
polystyrene and polymethyl methacrylate, denoted PS-PMMA;
polystyrene and polylactic acid, denoted PS-PLA,
polystyrene and poly(ethylene oxide), denoted PS-PEO;
polystyrene and polydimethylsiloxane, denoted PS-PDMS;
polystyrene, polymethyl methacrylate and poly(ethylene oxide), denoted PS-PMMA-PEO;
polystyrene and poly(2-vinylpyridine), denoted PS-P2VP.

By way of example, when the block copolymers of the second layer 5 are polystyrene-b-poly(methyl methacrylate), denoted PS-b-PMMA, of lamellar form, the random polymer of the functionalization layer is advantageously polystyrene-r-poly(methyl methacrylate), denoted PS-r-PMMA, preferably comprising 50% by weight of PS and 50% by weight of PMMA. Stage $g_1$) is preferably carried out by spin coating. The spin coating can be carried out by diluting the random polymer in an organic solvent. When the random polymer is PS-r-PMMA, the organic solvent can be propylene glycol monomethyl ether acetate, denoted PGMEA. The solution of the random polymer diluted in the organic solvent can exhibit a concentration by weight of the order of 1.5%. Stage $g_2$) can be carried out by a thermal annealing at a temperature of the order of 250° C. for a period of time of the order of 10 minutes. The thermal annealing can be carried out on a hot plate or in an oven. When the random polymer can be crosslinked, such a thermal annealing makes possible the crosslinking of the random polymer. Stage $g_2$) can comprise a rinsing stage during which the surplus of random polymer is removed using a solvent. When the random polymer is PS-r-PMMA, the solvent is preferably PGMEA. Stage $g_3$) is preferably carried out by spin coating. The spin coating can be carried out by diluting the block copolymer in an organic solvent. When the block copolymer is PS-b-PMMA, the organic solvent can be PGMEA. The solution of the block copolymer diluted in the organic solvent can exhibit a concentration by weight of the order of 1.5%. Stage $g_3$) is advantageously followed by a thermal annealing which makes possible the self-assembling of the block copolymer PS-b-PMMA and the selective removal of the PS-r-PMMA. The thermal annealing is preferably carried out at a temperature of the order of 250° C. for a period of time of the order of 10 minutes.

The second layer 5 of block copolymers which is formed during stage g) advantageously exhibits a thickness of between 30 nm and 50 nm.

Structuring of the Second Electrode

Stage h) is preferably carried out by a plasma etching. As non-limiting examples, it is possible to use, as gas, $O_2$, Ar, $COH_2$ or $N_2H_2$. Stage h) can also be carried out using a UV treatment, followed by a wet development (e.g. acetic acid).

Removal of the Second Layer of Block Copolymers

Stage i) is preferably carried out using a UV treatment, followed by a wet-route development. Stage i) can also be carried out by a plasma etching.

Encapsulation

Figure 1G:
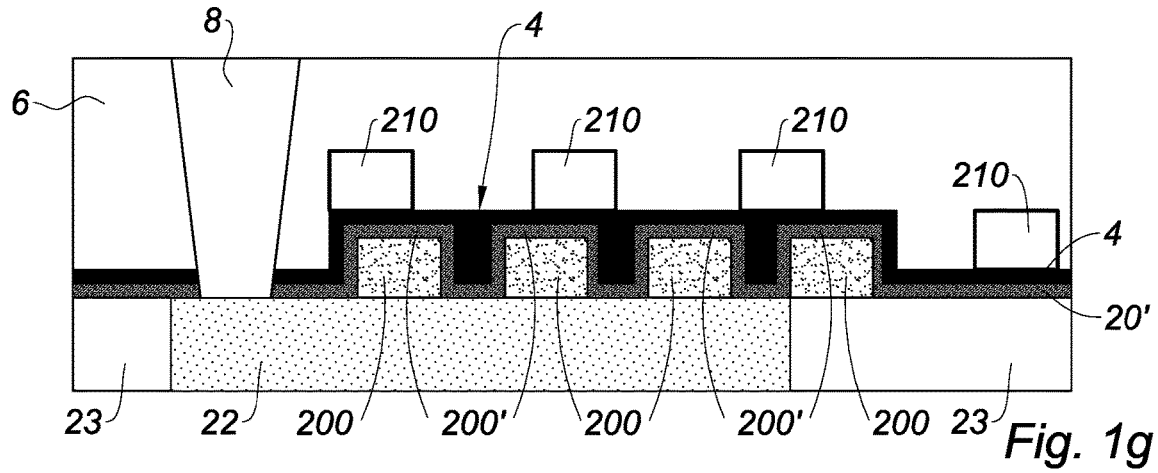
Figure 2:
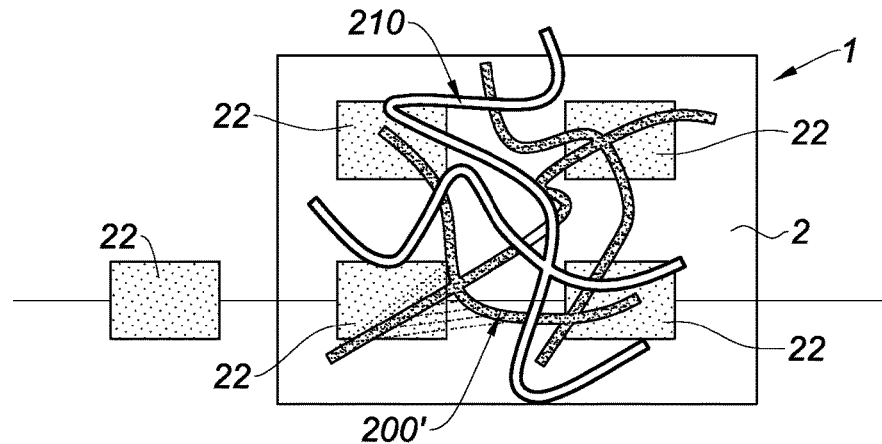
FIG. 2 is a diagrammatic top view of a calculator obtained by a process according to the invention.

As illustrated in FIG. 1g, the process advantageously comprises a stage j) consisting in forming an encapsulation layer 6 on the second electrode structured 210 during stage h), stage j) being carried out after stage i). The encapsulation layer 6 is preferably a layer of an oxide, such as $SiO_2$ or SiN.

Electrical Contacts

As illustrated in FIG. 1g, the process preferably comprises a stage k) consisting in forming an electrical contact pad 8, in contact with the metallization layer 22. Stage k) is carried out after stage j). Stage k) comprises a stage of etching the encapsulation layer 6 formed on the structured second electrode 210.

The invention is not limited to the embodiments set out. A person skilled in the art is in a position to consider their technically effective combinations and to replace them with equivalents.

The invention claimed is:

1. Process for the manufacture of a recurrent neural network calculator, comprising the successive stages:
   a) providing a substrate comprising a dielectric layer;
   b) forming a first layer of block copolymers on a part of the dielectric layer, so that the dielectric layer exhibits free zones with a random spatial distribution;
   c) etching the free zones of the dielectric layer, so as to structure the dielectric layer;
   d) removing the first layer of block copolymers;
   d') forming a first electrode on the dielectric layer structured during stage c);
   e) forming a memory layer, of resistive memory type, on the first electrode;
   forming a second electrode on the memory layer;
   g) forming a second layer of block copolymers on a part of the second electrode, so that the second electrode exhibits free zones with a random spatial distribution;
   h) etching the free zones of the second electrode, so as to structure the second electrode; and
   i) removing the second layer of block copolymers.

2. The process according to claim 1, in which stage b) comprises the successive stages:
   $b_1$) forming a layer of a random polymer on the dielectric layer;
   $b_2$) grafting the layer of the random polymer to a part of the dielectric layer;
   $b_3$) forming the first layer of block copolymers on the layer of the random polymer grafted during stage b2); and
   $b_4$) removing the grafted layer of the random polymer.

3. The process according to claim 1, in which stage g) comprises the successive stages:
   $g_1$) forming a layer of a random polymer on the second electrode;
   $g_2$) grafting the layer of the random polymer to a part of the second electrode;
   $g_3$) forming the second layer of block copolymers on the layer of the random polymer grafted during stage g2); and
   $g_4$) removing the grafted layer of the random polymer.

4. The process according to claim 2, in which the random polymer is selected from the group consisting of a statistical copolymer, a homopolymer and a self-assembled monolayer.

5. The process according to claim 1, in which the block copolymers of the first layer and of the second layer are selected from the group consisting of:
   polystyrene and polymethyl methacrylate, denoted PS-PMMA;
   polystyrene and polylactic acid, denoted PS-PLA;
   polystyrene and poly(ethylene oxide), denoted PS-PEO;
   polystyrene and polydimethylsiloxane, denoted PS-PDMS;
   polystyrene, polymethyl methacrylate and poly(ethylene oxide), denoted PS-PMMA-PEO; and
   polystyrene and poly(2-vinylpyridine), denoted PS-P2VP.

6. The process according to claim 1, in which the memory layer is made of at least one material selected from the group consisting of $HfO_2$, $Al_2O_3$, $SiO_2$, ZrO, a titanium oxide, a chalcogenide and $Ta_2O_5$.

7. The process according to claim 1, in which the first and second electrodes are made of at least one material selected from the group consisting of Ti, TiN, Pt, Zr, Al, Hf, Ta, TaN, C, Cu and Ag.

8. The process according to claim 1, in which the first layer of block copolymers and the second layer of block copolymers respectively formed during stages b) and g) exhibit a thickness of between 30 nm and 50 nm.

9. The process according to claim 1, comprising a stage j) consisting in forming an encapsulation layer on the second electrode structured during stage h), stage j) being carried out after stage i).

10. The process according to claim 1, in which the dielectric layer structured during stage c) exhibits a pitch, denoted p, and in which stages d') and e) are carried out so that the first electrode and the memory layer respectively exhibit first and second thicknesses, denoted $T_1$ and $T_2$, adhering to:

$$\frac{p}{2} \leq T_1 + T_2 \leq p.$$

11. Recurrent neural network calculator obtained by the process according to claim 1.

12. The process according to claim 3, in which the random polymer is selected from the group consisting of a statistical copolymer, a homopolymer and a self-assembled monolayer.

* * * * *